(12) United States Patent  
Torunoglu et al.

(10) Patent No.: US 7,546,574 B2
(45) Date of Patent: Jun. 9, 2009

(54) OPTICAL PROXIMITY CORRECTION ON HARDWARE OR SOFTWARE PLATFORMS WITH GRAPHICAL PROCESSING UNITS

(75) Inventors: Ilhami H. Torunoglu, Monte Sereno, CA (US); Ahmet Karakas, Palo Alto, CA (US)

(73) Assignee: Gauda, Inc., Sunnyvale, CA (US)

( * ) Notice: Subject to any disclaimer, the term of this patent is extended or adjusted under 35 U.S.C. 154(b) by 410 days.

(21) Appl. No.: 11/566,140

(22) Filed: Dec. 1, 2006

(65) Prior Publication Data
US 2007/0130559 A1    Jun. 7, 2007

Related U.S. Application Data

(60) Provisional application No. 60/741,686, filed on Dec. 2, 2005, provisional application No. 60/741,687, filed on Dec. 2, 2005.

(51) Int. Cl.
*G06F 17/50*    (2006.01)
(52) U.S. Cl. ............................. 716/19; 716/21
(58) Field of Classification Search ............ 716/19–21; 382/144–145; 430/5, 22
See application file for complete search history.

(56) References Cited

U.S. PATENT DOCUMENTS

| | | | |
|---|---|---|---|
| 5,553,274 A | 9/1996 | Liebmann | |
| 5,682,323 A | 10/1997 | Pasch et al. | |
| 5,723,233 A | 3/1998 | Garza et al. | |
| 6,467,076 B1 | 10/2002 | Cobb | |
| 6,803,554 B2 | 10/2004 | Ye et al. | |
| 6,806,456 B1 | 10/2004 | Ye et al. | |
| 6,807,503 B2 | 10/2004 | Ye et al. | |
| 6,820,028 B2 | 11/2004 | Ye et al. | |
| 6,828,542 B2 | 12/2004 | Ye et al. | |
| 6,879,924 B2 | 4/2005 | Ye et al. | |
| 6,884,984 B2 | 4/2005 | Ye et al. | |
| 6,892,156 B2 | 5/2005 | Ye et al. | |
| 6,906,305 B2 | 6/2005 | Pease et al. | |
| 6,959,255 B2 | 10/2005 | Ye et al. | |
| 6,969,837 B2 | 11/2005 | Ye et al. | |
| 6,969,864 B2 | 11/2005 | Ye et al. | |
| 6,978,438 B1 * | 12/2005 | Capodieci ................. 716/21 |
| 7,003,758 B2 | 2/2006 | Ye et al. | |
| 7,053,355 B2 | 5/2006 | Ye et al. | |
| 7,080,349 B1 * | 7/2006 | Babcock et al. ............ 716/19 |
| 7,111,277 B2 | 9/2006 | Ye et al. | |
| 7,114,145 B2 | 9/2006 | Ye et al. | |
| 7,117,477 B2 | 10/2006 | Ye et al. | |
| 7,117,478 B2 | 10/2006 | Ye et al. | |
| 7,120,895 B2 | 10/2006 | Ye et al. | |
| 2005/0138597 A1 | 6/2005 | Aleshin et al. | |
| 2006/0242618 A1 * | 10/2006 | Wang et al. ............... 716/19 |

* cited by examiner

*Primary Examiner*—Paul Dinh
(74) *Attorney, Agent, or Firm*—Aka Chan LLP

(57) ABSTRACT

Optical proximity correction techniques performed on one or more graphics processors improve the masks used for the printing of microelectronic circuit designs. Execution of OPC techniques on hardware or software platforms utilizing graphics processing units. GPUs may share the computation load with the system CPUs to efficiently and effectively execute the OPC method steps.

24 Claims, 5 Drawing Sheets

OPTICAL PROXIMITY CORRECTION ON HARDWARE OR SOFTWARE PLATFORMS WITH GRAPHICAL PROCESSING UNITS

CROSS-REFERENCE TO RELATED APPLICATIONS

This application claims priority under 35 U.S.C. § 119(e) to U.S. provisional applications 60/741,686 and 60/741,687, both filed Dec. 2, 2005, which are incorporated by reference along with any other references cited in this application.

BACKGROUND OF THE INVENTION

The present invention relates to the field of electronic design automation and, in particular, to improved techniques for performing optical proximity correction.

The manufacture of integrated circuits strives to place ever smaller features onto a given area of the integrated circuit chip. One challenge encountered in this effort to fabricate smaller features is the diffraction of the light used in photolithography. That is, the quality and fidelity of the microlithography stage of very large scale integrated (VLSI) circuit chip production depends on the wavelength of the light source and the size of the features to be printed.

Recent sub-wavelength lithography approaches aim to use wavelengths that are larger than the minimum feature size to generate the images, (e.g., light with a wavelength of 193 nanometers is being used to generate features with dimensions of 90, 65, or 45 nanometers). This approach, however, requires methods for the correction of degradations and distortions in the final pattern caused by light diffraction. That is, the photolithography mask used to generate the desired circuit pattern includes structures that anticipate and, at least partially correct for, the imperfections arising from striving to fabricate small features.

A computational simulation of the exposure and lithographic is run and the degradations or distortions are computed with various additions, inclusions and adjustments to the mask design. A mask design is selected that improves the final structure. These methods, commonly known as optical proximity correction (OPC), are mainly dependent on the optical system and mask features and may be computationally intensive. While regions having densely packed features tend to be more prone to distortions (the "proximity" effect), OPC calculations are not limited to such regions and can be advantageously applied to less-dense regions of the circuit.

OPC typically numerous features in a pattern layout to be computationally processed one or more times. Recent advances in semiconductor manufacturing allow billions of transistors (i.e., multibillion features) to be placed on a single chip. The well-known "Moore's law" postulates that the number of transistors that can be placed on a single chip doubles about every 12-24 months. Unfortunately, despite the advances in the central processing unit (CPU) clock speed and computing power, the gap between the computational power required for OPC calculations and the available CPU processing power keeps increasing. That is, the computing power required to efficiently execute the OPC calculations in a timely manner is growing at a faster rate than the available CPU power in a reasonably priced engineering workstation.

To further complicate the issue, the number of masks or layers to which OPC should be applied increases at each new semiconductor device manufacturing node. Since the features are getting smaller with every manufacturing node while the illumination wavelengths remain the same or decrease at a slower rate, the number of neighboring features effecting the fidelity of each feature increases. Therefore, the computational processing power required to perform OPC operations on new chip designs has been increasing at a rate of approximately factors of three or four or more for each successive manufacturing node.

Presently, the generation of optically corrected masks takes from many hours to several days per mask and the complexity of this process continues to grow. Because the features printed after the OPC process may still be different from the desired features, the impact of each feature on the functionality and performance of the chip needs to be readdressed in an iterative manner. A typical VLSI design process consists of several iterations of mask generation, OPC process, and interpretation of the results. These iterations may contribute several months of delay in the chip qualification and manufacturing process.

The persistent time-to-market pressures on new chip designs mandate improved methods to estimate and shorten the impact of the OPC process in the early stages of the design. Since it is computationally prohibitive to perform many iterations of OPC on a full-chip scale, partial or simple model-based OPC approaches are being applied in limited fashion, still necessitating full-chip OPC once the design is completed.

Therefore, a need exists in the art for improved systems and methods that shorten the time required to perform OPC, improve the accuracy of OPC methods, and are scalable to address larger chip designs.

BRIEF SUMMARY OF THE INVENTION

The present invention relates generally to the field of manufacturing integrated circuits and, more particularly, to using optical proximity correction (OPC) to improve the masks used for the printing of microelectronic circuit designs. Specifically, the present invention relates to the execution of OPC techniques on hardware or software platforms, or a combination of these, utilizing specialized processing units.

Accordingly and advantageously the present invention relates to systems and methods for the execution of OPC algorithms on hardware or software platforms, or combination, with specialized processing units.

In some embodiments of the present invention, spatial domain OPC computations are executed on a hardware or software system, or combination, comprising one or more specialized processing units. Examples of the specialized processing units include central processing units (CPUs), graphical processing units (GPUs), physics processors, cell processors, digital signal processors (DSPs), field programmable gate arrays (FPGAs), application specific integrated circuits (ASICs), and the like. Portions of the OPC computational task may be transformed into the form of mathematical manipulations on matrices and vectors. GPUs may be particularly well suited to performing such operations on matrix and vector data.

The GPU or GPUs may operate on the data until the result converges on the target model within a predetermined error limit. The operations may include changing the shapes of mask features and may include a detailed model of the illumination and optics systems used for exposing the pattern in the photoresist layer. The final data may be transformed back to the original data format and exported for generation of the mask used to print the pattern on the semiconductor device. GPUs will be used as an example of a specialized processor, but this is not intended to limit the scope of the teaching of the present invention to GPUs. The present invention may utilize any of the specialized processors mentioned previously, and other substantially similar processors as understood by those having ordinary skills in the art and as similar or related processors may be developed later.

In an embodiment, the invention is includes: a computing system having at least one central processing unit and at least one graphics processing unit; a user interface for interacting with the computer system; a computer readable medium including data describing the size and placement of features to be formed on a photolithography exposure mask used to manufacture semiconductor devices; a computer readable medium including optical proximity correction calculation procedures for acting upon the data, where at least a portion of the optical proximity correction calculation procedures are executed using the graphics processing unit; and output devices for displaying the results of applying the optical proximity correction calculation procedures executed using the graphics processing unit upon the data.

In an embodiment, the invention is a method including: providing a system having at least one central processing unit and at least one graphics processing unit; separating an optical proximity correction process into tasks depending on a type of computation required; allocating the tasks of the optical proximity correction process to the central processing unit or the graphics processing unit; and delivering output of the central processing unit and the graphics processing unit as a result of the optical proximity corrections process.

In an embodiment, the invention is includes: a computing system including a number of nodes, where each node includes at least one of at least one central processing unit or at least one graphics processing unit; an interface to couple the nodes together; a user interface for interacting with the computer system; a computer readable medium including data describing the size and placement of features to be formed on a photolithography exposure mask used to manufacture semiconductor devices; and a computer readable medium including optical proximity correction calculation procedures for acting upon the data, where at least a portion of the optical proximity correction calculation procedures are executed using the graphics processing unit in one of the nodes.

The interface may be at least on of a PCI Express bus, AGP bus, front side bus, Ethernet, the Internet, or other interface that facilitates the transfer of data in any form including serial or parallel. The computer readable medium having data describing the size and placement of features to be formed on a photolithography exposure mask used to manufacture semiconductor devices may be directly connected to one of the nodes and a portion of the data are passed through the interface to at least one other node. The direct connection may be by way of a different interface than how the nodes are connected. For example, the direct connection may be by an IDE, SATA, or USB interface.

The computer readable medium having optical proximity correction calculation procedures for acting upon the data is directly connected to one of the plurality of nodes, and at least a portion of the optical proximity correction calculation procedures are executed using the graphics processing unit on a different node from which the optical proximity correction calculation procedures are directly connected. The computer readable medium having optical proximity correction calculation procedures for acting upon the data is directly connected to one of the nodes, and at least a portion of the optical proximity correction calculation procedures are executed using the graphics processing unit of the node to which the optical proximity correction calculation procedures are directly connected.

The system may include a computer readable medium having optical proximity correction calculation procedures to split given layout information into two-dimensional subregions, where these subregion overlap with each other. There may be a computer readable medium having optical proximity correction calculation procedures to transfer the given layout information split-up into two-dimensional subregions to two or more nodes of the system. A computer readable medium having optical proximity correction calculation procedures executing on the two or more nodes may operate on the given layout information split-up into two-dimensional subregions.

A computer readable medium having optical proximity correction calculation procedures to combine results from a first node and a second node on the given layout information split-up into two-dimensional subregions. The optical proximity correction calculation procedures may combine results by stitching together the results by removing the overlapping regions.

Other objects, features, and advantages of the present invention will become apparent upon consideration of the following detailed description and the accompanying drawings, in which like reference designations represent like features throughout the figures.

DETAILED DESCRIPTION OF THE INVENTION

The invention can be readily utilized in the improvement of OPC methods used in the manufacture of semiconductor devices.

Structures arising in the manufacture of microelectronic devices are typically formed by creating a pattern of the desired structure in a layer of photoresist deposited over the material in which the desired structure is to be formed. The pattern in the photoresist is created by exposing the photoresist to light through a patterned exposure mask. The exposed photoresist serves as a physical mask during subsequent etch step or steps where the pattern in the photoresist is transferred to the underlying material.

Distortions and degradations in the final structure arise from a combination of factors including light source variations, optical proximity effects, development process nonuniformities, and etch process nonuniformities, among others. The total amount of energy deposited in a given volume of photoresist during the exposure or printing step will determine if that volume remains or is removed during the subsequent development process. The image features being printed on current microelectronic devices may be much smaller than the wavelengths of light being used to print the features, (e.g., light with a wavelength of 193 nanometers is being used to generate features with dimensions of 90, 65, or 45 nanometers and below). The distortions may cause errors such as line thinning, end shortening, line thickening, clipping, and the like.

Figure 1A:
FIG. 1A is a schematic representation of a typical pattern printed on a typical mask.
Figure 1A:
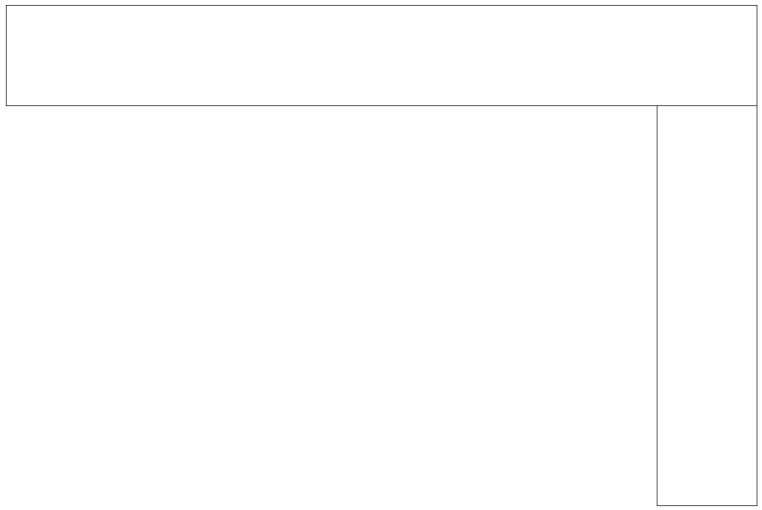
Figure 1B:
FIG. 1B shows the resulting pattern developed in the photoresist without OPC.
Figure 1B:

FIGS. 1A and 1B illustrate a typical example where the feature on the exposure mask is formed with the same size and shape as the desired structure on the chip (FIG. 1A). Due to the distortions described previously, the resulting pattern may not faithfully reproduce the pattern in the exposure mask as illustrated in FIG. 1B. The distortions in this particular example have caused the final pattern to be shorter, thinner, and poorly controlled.

Various methods of OPC may be used to improve the fidelity of the final pattern transferred to the target material. The pattern that is formed on the exposure mask may be altered to compensate for various systematic distortions. One such method involves the use of serifs to augment the pattern in areas where the distortions cause feature shortening, thinning, and the like. A serif is understood to be a small feature that may be placed at a corner or vertex of a main feature. The serif may be "positive" in that it adds area to the main feature or it may be "negative" in that it subtracts area from the main feature.

Figure 2A:
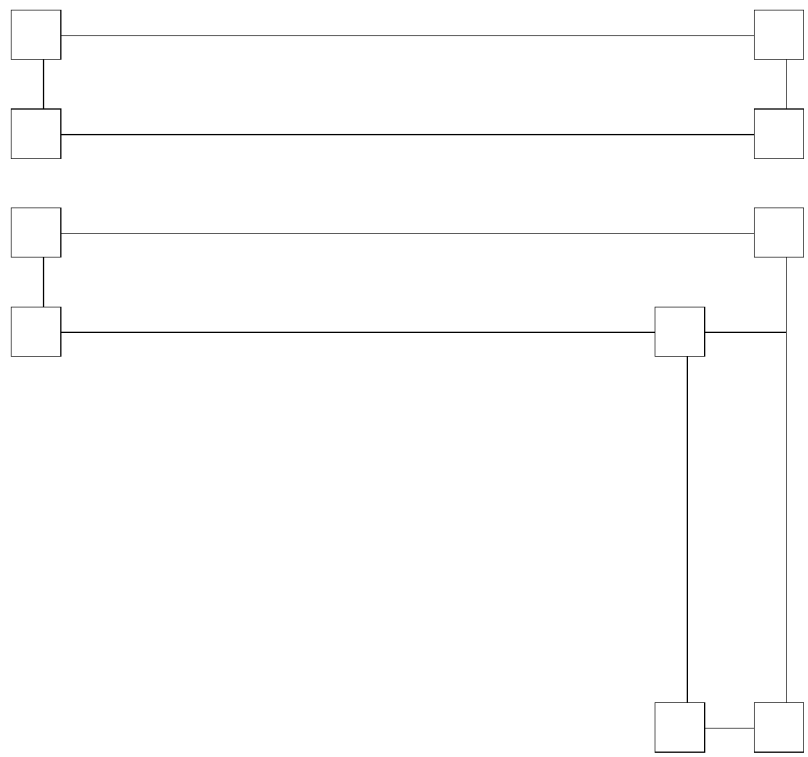
FIG. 2A is a schematic representation of a typical OPC-corrected pattern printed on a typical mask.
Figure 2B:
FIG. 2B shows the resulting pattern developed in the photoresist.

FIGS. 2A and 2B illustrate a typical example of the use of both positive and negative serifs (FIG. 2A) on the exposure mask to alter the feature. FIG. 2B illustrates the resulting structure realized on the chip as a result of the successful use of this OPC technique. The goal of the OPC process is to calculate, improve, and ideally to optimize every feature on the exposure mask so that the resulting structure realized on the chip meets the design and performance requirements of the circuit. Clearly, when the chip has billions of transistors, each with many fine structures, the computational requirements for OPC can be very large.

Popular OPC methods in current use include two main classes, frequency domain OPC computations and spatial domain OPC calculations.

The frequency domain (FD) OPC computations use Fourier transform techniques to calculate the deformation of the features on the exposure mask to realize the desired structure on the chip. There are typically several steps to this method:

FD-1. The layout is pixilated (e.g., digitized as a pattern of pixels) and transformed into the 2-dimensional frequency domain.

FD-2. The low-pass filtering effects of the process, such as the lens system, etching characteristics, and so forth, are introduced.

FD-3. An inverse filtering process is applied to compensate for the low-pass filtering effects introduced in the previous step.

FD-4. A 2-dimensional inverse filtering is applied to transform the results of these calculations back from the frequency domain into the spatial domain.

The accuracy of the frequency domain OPC calculations increases as the number of points used increases. Many points must be used to include all of the local structures that may impact the distortion of the feature being optimized. However, each of these neighboring local structures must also be optimized. The ideal situation is to consider the entire chip within a single calculation. However, this also dramatically increases the computational requirement. Therefore, this FD method has limited use.

The spatial domain (SD) OPC calculations are based on the spatial properties of the features. The edges and vertices of the features on the exposure mask, such as polygons or rectangles, are modified in an effort to minimize the difference between the actual structure realized using the corrected exposure mask and the desired structure. There are several steps to this method.

The candidate control points, or evaluation points, on the edges and vertices are determined based on current design rules. An example of a flow is:

SD-1. For every edge, or fragment of an edge, an edge placement error (EPE) is determined by a model of the optical system. Calculations are performed using system kernels and their convolution with the exposure mask region around each edge.

SD-2. Upon determining an edge placement error, an edge fragment may be "pushed" or "pulled" in an attempt to reduce the error.

SD-3. The simulations and adjustments are repeated several times for each edge fragment until the edge placement error is within the acceptable range for all features on the chip.

The spatial domain OPC methods enjoy several benefits over the frequency domain methods. The light effects are generally localized to the features in the immediate vicinity of the feature under consideration. Therefore, the size of a specific calculation may be smaller. However, the same calculation must be made for all of the feature groups on the chip.

Currently, typical solutions to the OPC computational problem include the use of large systems of multi-CPU computers. This increases the cost of the system and contributes to the cost of the chip. CPUs are typically designed for minimal latency and to address general purpose programs. This hardware configuration will be defined here as a "homogeneous configuration" meaning that the various computational tasks are executed by equivalent processors.

An alternative hardware configuration includes a cooperative collection of specialized processing units where each processing unit may be well suited for a specific type of computation. This hardware configuration will be defined here as a "heterogeneous configuration" meaning that the various computational tasks are executed by different, typically specialized, processors. As an example, GPUs are designed specifically for high throughput on specialized types of problems found in graphics processing that require a large number of arithmetic calculations with a relatively small number of memory access steps. Other specialized processors may be designed to handle other types of data or computational problems. Allocating the various portions of the OPC computations to specialized processors may improve the throughput, increase the efficiency, lower the cost, and improve the results of the computation.

GPUs may be designed for fast graphics processing. The data may be organized into a stream where a stream is an ordered set of data of the same data type. Operations, procedures, methods, algorithms, and the like that may be applied to entire streams of data are typically called kernels. Kernels are very efficient because they depend only on their input. Internal computations within the kernel are independent of other elements of the stream. Therefore, GPUs may be designed for parallel processing, memory efficiency, and high throughput for specific problems.

GPUs typically have hardware blocks that may be specifically designed for certain types of problems (e.g., specific kernels may be implemented in hardware). As an example, hardware blocks may be designed to implement various types of vector or matrix computations, or both. As an example, graphics data is typically four-dimensional referring to the channel value of the red, green, and blue pixels (referred to as RGB) and the opacity value (typically referred as alpha or A). Therefore, GPUs have been designed to process four-dimensional (RGBA) data very quickly and very efficiently.

CPU-based approaches to improve the OPC procedures typically employ multi-CPU systems as mentioned previously. Such approaches typically have attempted to increase the computational efficiency by dividing the computation into parallel parts at the task level. However, they are not able to exploit additional parallelism at the instruction level due to their general purpose design.

OPC calculations are inherently graphics problems. In one embodiment of the present invention, graphics data in the form of rectangles or polygons may be sent by one or more CPUs to one or more GPUs. The GPUs may be designed to efficiently implement one or more kernels for the efficient execution of the steps of the OPC method described previously.

Typically, the following functions may be implemented with task level parallelism:

(i) Allocation of vertex shaders or vertex processors for evaluation point selection (step SD-1).

(ii) Allocation of vertex shaders for modification of evaluation points and their location (step SD-3).

(iii) Allocation of rasterization for determining the evaluation points based on 1-D and 2-D cost functions (step SD-1).

(iv) Allocation of pixel shaders or fragment processors, or both, for intensity calculations using fast kernel lookups or fast kernel calculations (step SD-2).

(v) Allocation of fragment tests such as depth tests for area query and tagging of edges and edge fragments (step SD-2). Other common fragment tests that may be used include scissor tests, alpha tests, stencil tests, blending tests, dithering tests, logical operations, and the like.

In a GPU, vertex shaders or vertex processors are a programmable unit that operates on incoming vertex values and their associated data. Rasterization is the conversion of both geometric and pixel data into fragments. Pixel shaders or fragment processors are programmable units that operate on fragment values and their associated data. Depth tests are, for each pixel, the depth buffer keeps track of the distance from the viewpoint and the object occupying that pixel. Then, if the specified depth test passes, the incoming depth value replaces the value already in the depth buffer.

Typically, the following functions may be implemented with evaluation point parallelism:

(i) Each pixel shader computes one evaluation point in parallel (step SD-2).

(ii) Efficient use of four-dimensional pixel values and pixel operations for fast kernel computation (step SD-2).

Typically, the following functions may be implemented with instruction level parallelism:

(i) Mapping of convolution tables as texture maps/image maps (step SD-2).

(ii) Use of texture interpolation for optimizing texture cache use (step SD-2).

Texture maps or image maps are rectangular arrays of data (e.g., color data, luminance data, color and alpha data, and the like). Texture interpolation is mathematical interpolation between texture map or image map data.

Typically, the following special hardware functions may be implemented for searching and region query:

(i) Depth processor for selection of evaluation points (step SD-1).

(ii) Single-input multiple-data (SIMD) video processor for computing error terms (step SD-3).

(iii) Multiple-input multiple-data (MIMD) video processor for computing error terms (step SD-3).

A depth processor is a programmable unit that operates on incoming fragment or pixel values and their associated data. Video processor is a processor that performs video decoding or encoding operations on video data. The processor may be of a single-instruction multiple-data (SIMD) or multiple-instruction multiple-data (MIMD) type.

Thus, a subset of OPC calculations will map very efficiently onto typical GPU hardware and typical GPU programming features. Therefore, GPUs may share computations with CPUs to more efficiently manage OPC problems leading to higher throughput, lower cost, improved efficiency, and the like.

Figure 3:
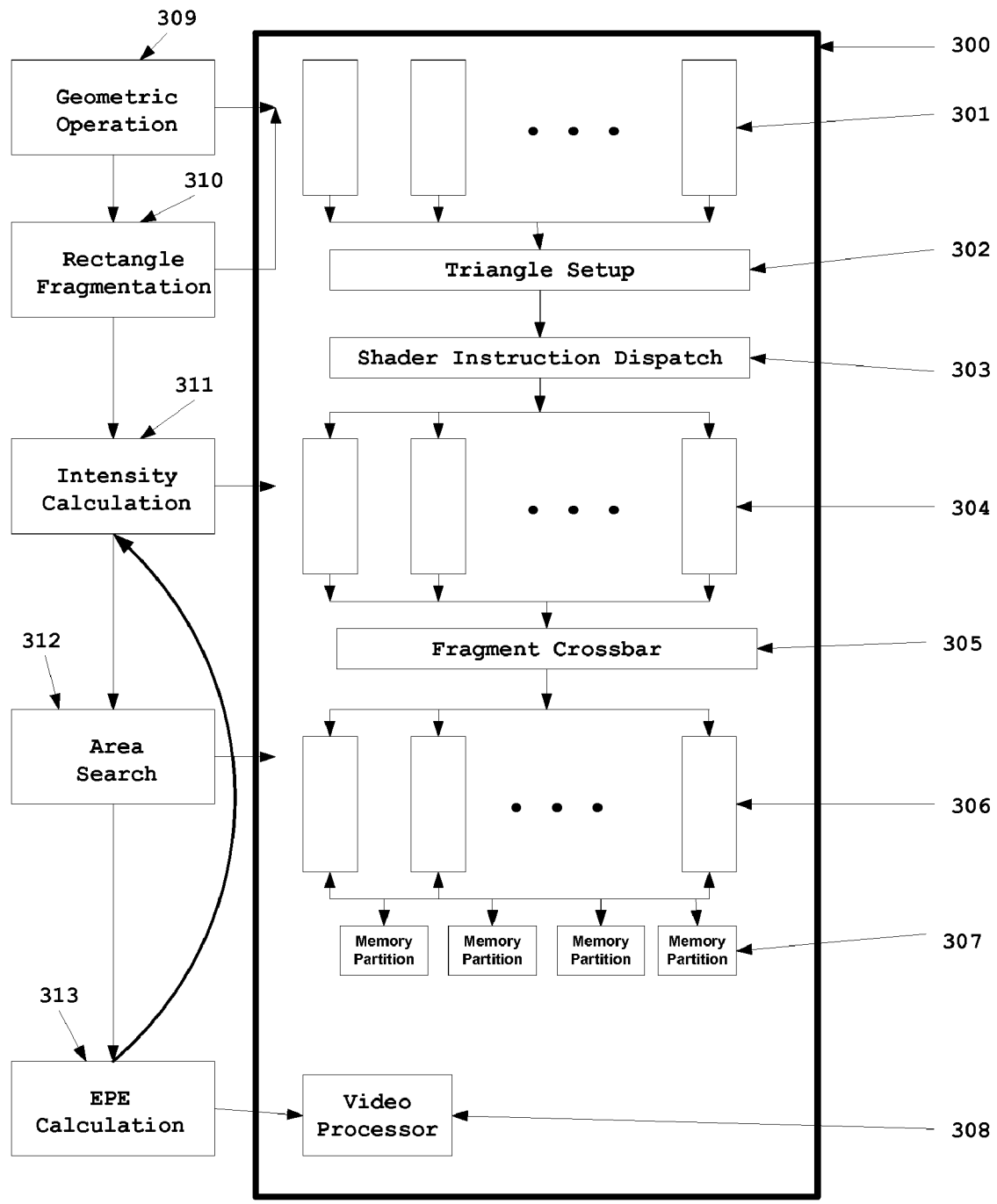
FIG. 3 is a schematic representation of a typical implementation for some OPC procedures on a typical commercial GPU.

FIG. 3 is a schematic representation of typical procedures for performing a typical OPC method on commercial GPU. The specific case illustrated uses an Nvidia GeForce® GPU processor, but the present invention may generally apply to any commercial GPU or similar device.

Various operations of an OPC flow are executed using a graphics processor 300. Some steps of an OPC flow include a geometric operation 309, rectangle fragmentation 310, intensity calculation 311, area search 312, and placement error or edge placement error (EPE) calculation 313. Geometric operations are. Rectangle fragmentation operations are. Intensity calculations are. Area search are. Placement error or EPE calculations are.

The graphics processor may be a single integrated circuit or multiple integrated circuits. For example, all the GPU components shown in the figure (e.g., blocks 301, 302, 303, 304, 305, 306, 307, and 308) may reside on a single integrated circuit. Or any combination of components may reside on one integrated circuit and other components reside on one or more other integrated circuits. Also a single integrated circuit may include one or more graphics processor cores.

In a graphics processor 300, there are one or more vertex processors 301, which are connected to a triangle setup block 302. A vertex processor is responsible for running the vertex shaders. The input for a vertex shader is the vertex data, namely its position, color, normals, an so forth. In a vertex shader, one can write code for tasks such as: vertex position transformation using the model view and projection matrices; normal transformation, and if required its normalization; texture coordinate generation and transformation; lighting per vertex or computing values for lighting per pixel; and color computation.

The triangle set up block does. The triangle set-up block is connected to a shader instruction dispatch 303. The shader instruction dispatch does. The shader instruction dispatch is connected to one or more fragment processors 304.

The fragment processor is where the fragment shaders run. This unit is responsible for operations like: computing colors, and texture coordinates per pixel; texture application; fog computation; and computing normals if one wants lighting per pixel. The inputs for a fragment processor this unit are typically the interpolated values computed in the previous stage of the pipeline such as vertex positions, colors, normals, and so forth.

The fragment processor is connected to a fragment crossbar 305. The fragment crossbar does. The fragment crossbar is connected to a stencil buffer 306. The stencil does. The stencil is connected to one or more memory partitions 307.

The graphics processor may have one or more video processors 308. The video processor does. The video processor is connected to. Any combination of the components shown in graphics processor 300 may included one integrated circuit. For example, a graphics processing unit integrated circuit may include a vertex processor unit and a fragment processor unit. The graphics processing unit integrated circuit may include a vertex shader unit and a stencil buffer unit.

In FIG. 3, the geometric operations and rectangle fragmentation (step SD-1) may map to the vertex processor hardware blocks of the GPU. The intensity calculation, area search, and edge placement error (EPE) calculation steps (step SD-2 through SD-4) may map to the fragment processor and depth filter hardware blocks of the GPU. EPE calculation may simply be referred to as placement error calculations, especially in embodiments of the invention where edges are not used.

Geometric operations may be performed in the CPU (outside the GPU), vertex processor, or fragment processor. Fragmentation operations may be performed in the CPU, vertex processor, or fragment processor. Intensity calculations may be performed in the fragment processor. Area search may be performed in the fragment processor or stencil. EPE calculations may be performed in the fragment processor or video processor. In OPC procedure, any combination of these operations may be performed with each other.

For example, the fragment processor may perform the geometric operations, fragmentation operations, intensity calculations, area search, and EPE calculations. In a further embodiment, the geometric operations and fragmentation operations may be performed by the CPU and the intensity calculations, area search, and EPE calculations may be performed in the GPU. In a further embodiment, the geometric operations and fragmentation operations may be performed by the vertex processor of the GPU and the intensity calculations, area search, and EPE calculations may be performed by the fragment processor of the GPU. In an embodiment, the area search may be performed in the stencil buffer of the GPU. In an embodiment, the EPE calculation may be performed using the video processor.

Positions of geometries of the layout may be represented in the four-dimensional space (RGBA) format provided in the GPU. In other words, a two-dimensional trapezoidal shape of the data is represented as four-channel data in the graphics processing unit. In specific implementations, the trapezoid may be a rectangle or square. In an embodiment, two opposite corners of a two-dimensional trapezoidal shape of the data is represented in a RGBA color space format in the graphics processing unit. For example, X1 will be R, Y1 will be G, X2 will be B, and Y2 will be A. The GPU will operate on the data stored in such a four-dimensional format.

In another embodiment, X and Y coordinates for a corner, a width, and a height of a two-dimensional trapezoidal shape of the data is represented in a RGBA color space format in the graphics processing unit. For example, X1 will be R, Y1 will be G, W will be B, and H will be A. The GPU will operate on the data stored in such a four-dimensional format.

In another embodiment, X and Y coordinates for a corner, a change in X, and a change in Y of a two-dimensional trapezoidal shape of the data is represented in a RGBA color space format in the graphics processing unit. For example, X1 will be R, Y1 will be G, delta X will be B, and delta Y will be A. The GPU will operate on the data stored in such a four-dimensional format.

In another embodiment, X and Y coordinates for a corner, an angle, and a scalar of a two-dimensional trapezoidal shape of the data is represented in a RGBA color space format in the graphics processing unit. For example, X1 will be R, Y1 will be G, theta will be B, and r will be A. The GPU will operate on the data stored in such a four-dimensional format.

There representations of OPC data in a GPU are merely examples of some representations that may be used. In other embodiments of the invention, other representation schemes may be used.

In an embodiment, a system of the invention includes: a computing system having at least one central processing unit and at least one graphics processing unit; a user interface for interacting with the computer system; a computer readable medium including data describing the size and placement of features to be formed on a photolithography exposure mask used to manufacture semiconductor devices; a computer readable medium including optical proximity correction calculation procedures for acting upon the data, where at least a portion of the optical proximity correction calculation procedures are executed using the graphics processing unit; and output devices for displaying the results of applying the optical proximity correction calculation procedures executed using the graphics processing unit upon the data. The graphics processing unit may include a vertex processor unit and a fragment processor unit. The graphics processing unit may include a vertex shader unit and a stencil buffer unit.

In an embodiment, there may be multiple CPUs and GPUs that perform the OPC calculations. A system of the invention may include multiple nodes which are connected with high speed interface or connections between them. This interface may include, for example, a PCI Express bus, AGP bus, front side bus, Ethernet, or the Internet, or a combination of these. Each node has one or multiple CPUs or one or more GPUs, or any combination of CPU and GPUs. Each node may or may not be equipped with a secondary storage area such as hard disk floppy, CD writer, or other. OPC software of the invention may be run on any of the machines.

For example, there may be a master program that runs on any subset of the nodes of the system. The master program may be executed on only one of the nodes. Data which OPC procedures of the invention will act upon may be associated with any node of the system. The master program may direct other nodes of the system to perform OPC calculations. The master program may coordinate operations of the computing system. The OPC procedures or data, or both, may be transferred from one node to any other node of the system. Results may then be passed back to the master program, where individual results are combined.

The graphics processing units and the optical proximity correction calculation procedures may include at least one of:

Procedures for allocation of vertex shaders for evaluation point selection.

Procedures for allocation of vertex shaders for modification of evaluation points and their location.

Procedures for allocation of rasterization for determining the evaluation points based on one-dimensional and two-dimensional cost functions.

Procedures for allocation of pixel and vertex shaders for intensity calculations including spatial or frequency-domain approaches to calculate intensity or electromagnetic fields, or a combination, in air or in the other media including resist materials and on a chip surface.

Procedures for allocation of pixel shaders for intensity and electromagnetic field calculations in air and in the resist material as well as other related locations on the chip surface including memory lookups or fast kernel calculations.

Procedures for allocation of pixel shaders for intensity calculations using other methods of calculating intensity or electromagnetic fields, or a combination, such as convolution in frequency domain using fast fourier transforms and inverse fourier transforms or any other transforms to the same effect in air or in the resist material as well as other related locations on the chip surface.

Procedures for allocation of pixel shaders for intensity calculations using fast kernel lookups or fast kernel calculations.

Procedure for allocation of g pixel shaders for intensity calculations using light lookups or light calculations.

Procedures for allocation of depth filters for area query and tagging of edges and edge fragments.

Procedures for pixel shader computation of evaluation points.

Procedures for mapping of convolution tables as texture maps.

Procedures for the use of texture interpolation for optimizing texture cache use.

Procedures for the use of a depth processor for the selection of evaluation points.

Procedures for the use of a single input multiple data (SIMD) video processor for computing error terms.

In a specific embodiment of the invention, a procedure splits the given layout information into two-dimensional subregions, where these regions overlaps with each other. There may be multiple such procedures running on separate nodes of a system. This information, as well as whole or partial layout information, is sent to each node where the nodes perform OPC-related calculation. The results of the calculations are collected (such as at a single node) where the information is stitched together by removing the overlapping regions. Stitching may be performed using a single node or multiple nodes in parallel.

In a specific embodiment, a procedure includes splitting a layout into a number of nonrectangular two-dimensional overlapping regions. The method splits the layout into overlapping two-dimensional rectilinear or polygonal spaces, sending whole or portions of the region or regions to each node. The method may perform OPC corrections (or reticle corrections) without sending or sharing any information between nodes. Portions or complete regional information may be provided to each node for parallel computation.

Figure 5:
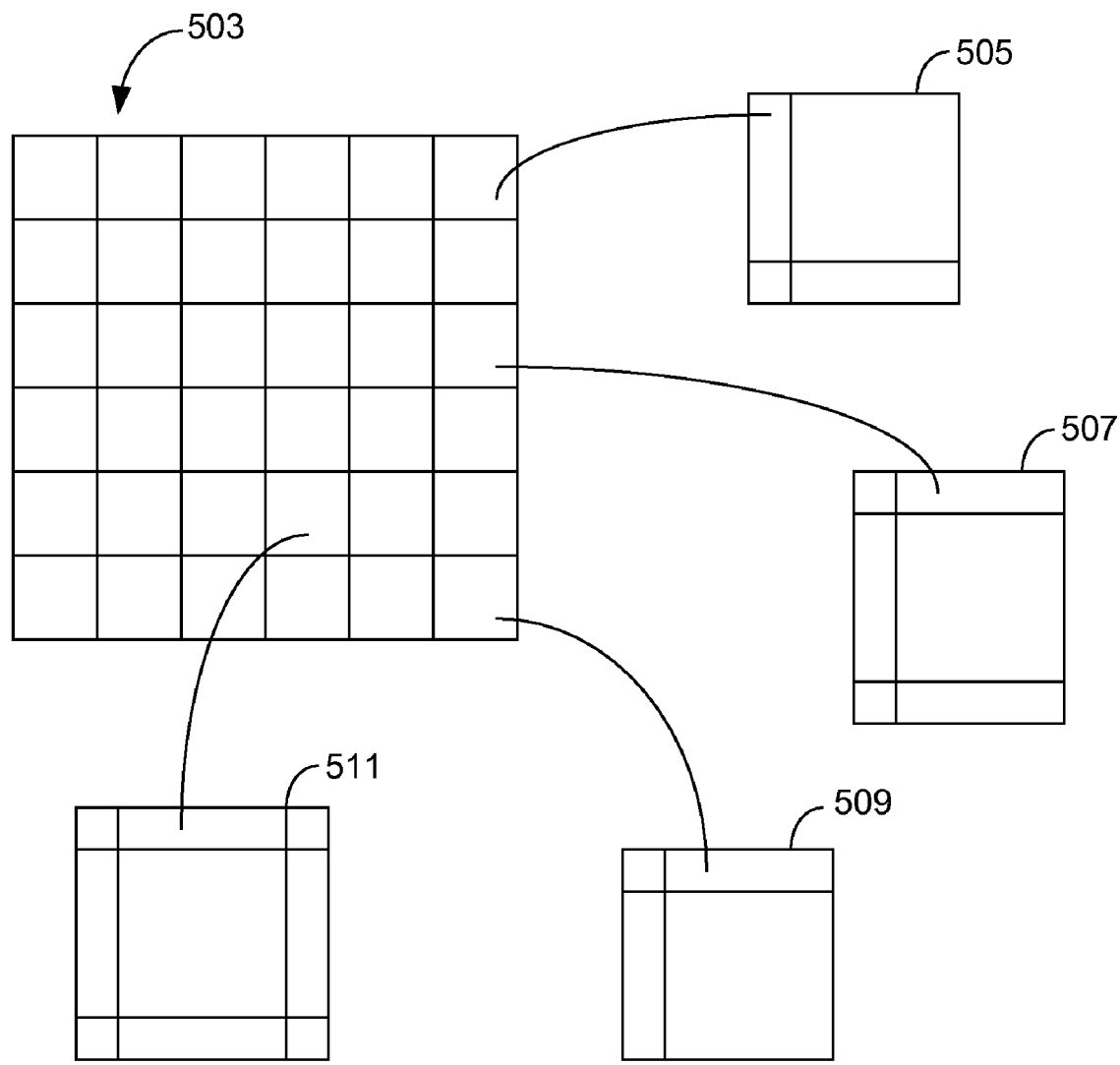
FIG. 5 shows partitioning of layout data and where each partition has overlapping regions from adjacent partitions.

FIG. 5 shows partitioning of layout data and where each partition has overlapping regions from adjacent partitions. In a technique of the invention, instead of performing calculations on an entire layout, the layout is divided or partitioned into a number of subregions. In this case, each subregion is two dimensional. In particular, a technique partitions a layout 503 into a number of regions or subregions. Although each region is shown as been rectangular in this figure, each partition may have any shape such as square, trapezoid, any polygonal, or other.

According to a specific approach, the data in each two-dimensional subregion is operated on by one or more computing nodes of the system. As discussed above, each node may include CPUs or GPUs, or both. In a specific implementation, each node has a GPU which performs OPC calculations on a specific subregion of the layout. Calculations may be performed on a number of subregions in parallel, which will speed up the calculations. Generally, the greater the number of nodes, the faster the calculations may be performed since more calculations will be performed in parallel. After a node has completed its calculations, the output results are transferred back to a calling node (such as the node where a master program is running) or to another specific location. Then, one or more computing nodes will assembly the output results for the individual partitions together to provide the OPC calculation output for the complete layout data.

In a specific implementation of the invention, each subregion is sent to a node including some overlapping region data from adjacent partitions. For example, for a corner partition, a subregion (see subregions 505 and 509) sent to a node will include overlap information from two adjacent sides. For an edge partition (not corner), subregion 507 sent to a node will include overlap information from three adjacent regions. For a middle partition, the subregion 511 will include overlap information from four adjacent regions. When performing the OPC calculations, the nodes will use these subregions including overlap data.

In a specific implementation, after the OPC calculations, the output from each node will be simply the output data for the subregion itself, without any overlap regions. Therefore, in this case, each node with have the overlap region as the input data, but not in the output data. This approach leads to more accurate results in the OPC calculations.

In a specific embodiment, the computation of the lithography process simulation for OPC and RET purposes which includes the mask preparation related calculations, EAPSM and AAPSM related calculations such as electromagnetic field computation to take into account the thick mask effects, the chemical processes happening during lithography processes including the exposure process, the postbake process, the chemical amplification process, the development process all or partially computed in pixel shaders or in combination of pixel and vertex shaders.

Figure 4:
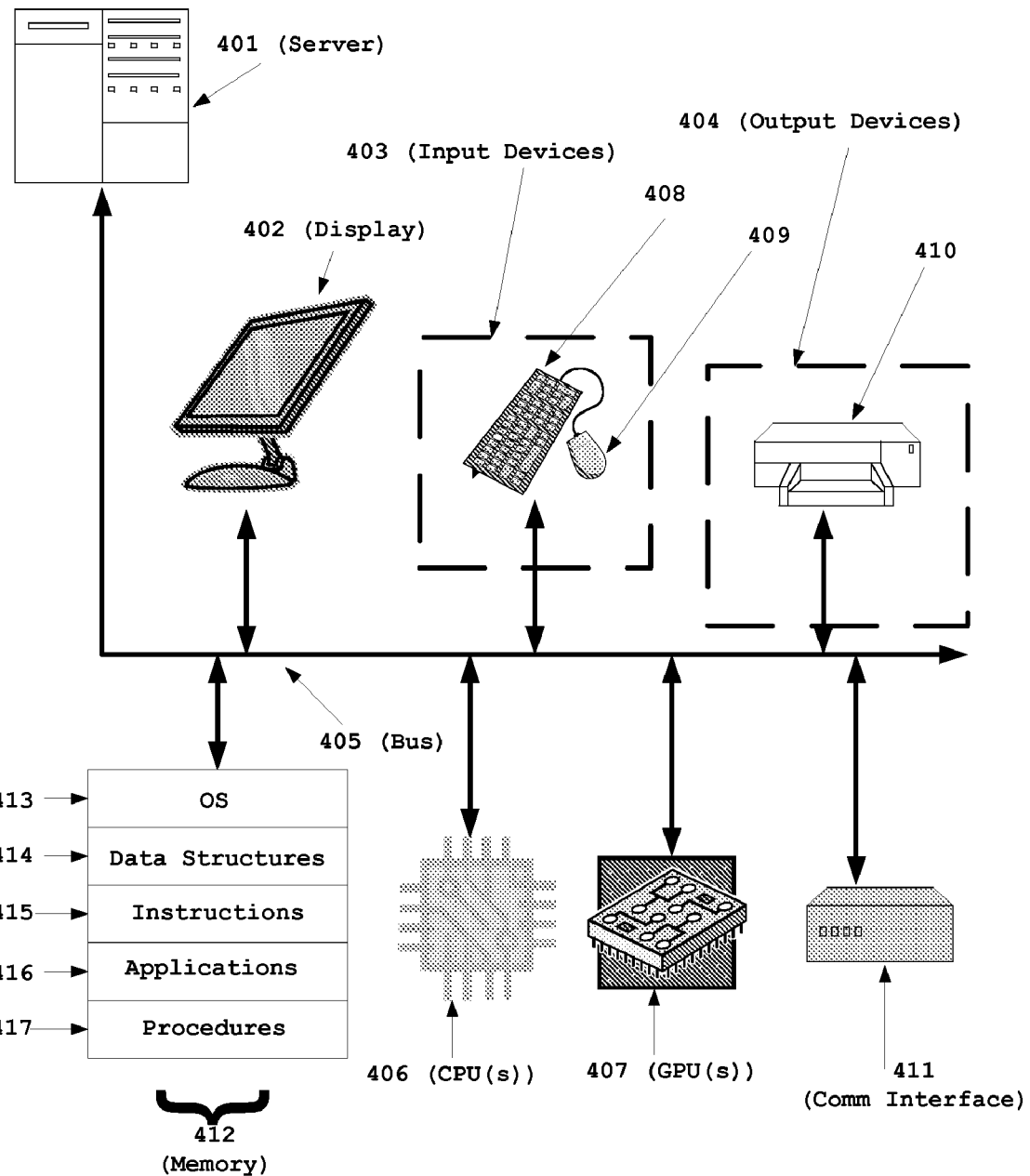
FIG. 4 depicts an illustrative computer system pertaining to various embodiments of the present invention.

FIG. 4 depicts an illustrative computer system pertaining to various embodiments of the present invention. In some embodiments, the computer system includes a server 401, display 402, one or more input interfaces 403, and one or more output interfaces 404, all conventionally coupled by one or more buses 405. Examples of suitable buses include PCI-Express®, AGP, PCI, ISA, and the like.

The computer system may include any number of graphics processors. The graphics processor may reside on the motherboard such as being integrated with the motherboard chipset. One or more graphics processors may reside on external boards connected to the system through a bus such as an ISA bus, PCI bus, AGP port, PCI Express, or other system buses. Graphics processors may on separate boards, each connected to a bus such as the PCI Express bus to each other and to the rest of the system. Further, there may be a separate bus or connection (e.g., Nvidia SLI or ATI CrossFire connection) by which the graphics processors may communicate with each other. This separate bus or connection may be used in addition to or in substitution for system bus.

The server 401 includes one or more CPUs 406, one or more GPUs 407, and one or more memory modules 412. Each CPU and GPU may be a single core or multiple core unit. Examples of suitable CPUs include Intel Pentium®, Intel Core™ 2 Duo, AMD Athlon 64, AMD Opteron®, and the like. Examples of suitable GPUs include Nvidia GeForce®, ATI Radeon®, and the like. The input interfaces 403 may include a keyboard 408 and a mouse 409. The output interface 404 may include a printer 410.

The communications interface 411 is a network interface that allows the computer system to communicate via a wireless or hardwired network. The communications interface 411, may be coupled to a transmission medium (not shown), such as a network transmission line, for example, twisted pair, coaxial cable, fiber optic cable, and the like. In another embodiment, the communications interface 411, provides a wireless interface, that is, the communication interface 411 uses a wireless transmission medium. Examples of other devices that may be used to access the computer system via communications interface 411 include cell phones, PDAs, personal computers, and the like (not shown).

The memory modules 412 generally include different modalities, illustratively semiconductor memory, such as random access memory (RAM), and disk drives as well as others. In various embodiments, the memory modules 412, store an operating system 413, data structures 414, instructions 415, applications 416, and procedures 417.

Storage devices may include mass disk drives, floppy disks, magnetic disks, optical disks, magneto-optical disks, fixed disks, hard disks, CD-ROMs, recordable CDs, DVDs, recordable DVDs (e.g., DVD-R, DVD+R, DVD-RW, DVD+RW, HD-DVD, or Blu-ray Disc), flash and other nonvolatile solid-state storage (e.g., USB flash drive), battery-backed-up volatile memory, tape storage, reader, and other similar media, and combinations of these.

In various embodiments, the specific software instructions, data structures, and data that implement various embodiments of the present invention are typically incorporated in the server, 401. Generally, an embodiment of the present invention is tangibly embodied using a computer readable medium, for example, the memory, and includes of instructions, applications, and procedures which, when executed by the processor, causes the computer system to utilize the present invention, for example, the collection and analysis of data, pixelating structures, determining edge placement errors, moving edge fragments, optimizing edge fragment placements, and the like. The memory may store the software instructions, data structures, and data for any of the operating system, the data collection application, the data aggregation application, the data analysis procedures, and the like in semiconductor memory, in disk memory, or a combination of these.

A computer-implemented or computer-executable version of the invention may be embodied using, stored on, or associated with computer-readable medium. A computer-readable medium may include any medium that participates in providing instructions to one or more processors for execution. Such a medium may take many forms including, but not limited to, nonvolatile, volatile, and transmission media. Nonvolatile media includes, for example, flash memory, or optical or magnetic disks. Volatile media includes static or dynamic memory, such as cache memory or RAM. Transmission media includes coaxial cables, copper wire, fiber optic lines, and wires arranged in a bus.

For example, a binary, machine-executable version, of the software of the present invention may be stored or reside in RAM or cache memory, or on a mass storage device. The source code of the software of the present invention may also be stored or reside on mass storage device (e.g., hard disk, magnetic disk, tape, or CD-ROM). As a further example, code of the invention may be transmitted via wires, radio waves, or through a network such as the Internet.

The operating system may be implemented by any conventional operating system comprising Windows® (registered trademark of Microsoft Corporation), Unix® (registered trademark of the Open Group in the United States and other countries), Mac OS® (registered trademark of Apple Computer, Inc.), Linux® (registered trademark of Linus Torvalds), as well as others not explicitly listed here.

In various embodiments, the present invention may be implemented as a method, system, or article of manufacture using standard programming or engineering techniques, or both, to produce software, firmware, hardware, or any combination thereof. The term "article of manufacture" (or alternatively, "computer program product") as used in this application is intended to encompass a computer program accessible from any computer readable device, carrier or media. In addition, the software in which various embodiments are implemented may be accessible through the transmission medium, for example, from a server over the network. The article of manufacture in which the code is implemented also encompasses transmission media, such as the network transmission line and wireless transmission media. Thus the article of manufacture also includes the medium in which the code is embedded. Those skilled in the art will recognize that many modifications may be made to this configuration without departing from the scope of the present invention.

The computer system illustrated in FIG. 4 is not intended to limit the present invention. Other alternative hardware environments may be used without departing from the scope of the present invention.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A system comprising:
 a computing system comprising at least one central processing unit and at least one graphics processing unit;
 a user interface for interacting with the computer system;
 a computer readable medium comprising data describing size and placement of features to be formed on a photolithography exposure mask used to manufacture semiconductor devices;
 a computer readable medium comprising optical proximity correction calculation procedures for acting upon the data, wherein at least a portion of the optical proximity correction calculation procedures are executed using the graphics processing unit; and
 output devices for displaying the results of applying the optical proximity correction calculation procedures executed using the graphics processing unit upon the data,
 wherein X and Y coordinates for two opposite corners of a two-dimensional trapezoidal shape of the data is represented in a RGBA (RED-GREEN-BLUE-ALPHA) color space format in the graphics processing unit.

2. The system of claim 1 wherein the graphics processing unit comprises a vertex processor unit and a fragment processor unit.

3. The system of claim 1 wherein the graphics processing unit comprises a vertex processor unit and a stencil buffer.

4. The system of claim 2 wherein the graphics processing unit further comprises a stencil buffer.

5. The system of claim 2 wherein the graphics processing unit further comprises a video processor unit.

6. The system of claim 1 wherein the graphics processing unit comprises a vertex processor unit, fragment processor unit, stencil buffer, and video processor unit.

7. The system of claim 1 wherein the optical proximity correction calculation procedures are shared between the central processing unit and the graphics processing unit.

8. The system of claim 7 wherein the at least one graphics processing unit is replaced by at least one of a physics processor, cell processors, digital signal processor, or application specific integrated circuit.

9. The system of claim 1 wherein graphics processing units and the optical proximity correction calculation procedures comprise at least one of:
 procedures for allocation of vertex shaders for evaluation point selection;
 procedures for allocation of vertex shaders for modification of evaluation points and their location;

procedures for allocation of rasterization for determining the evaluation points based on one-dimensional and two-dimensional cost functions;

procedures for allocation of pixel and vertex shaders for intensity calculations including spatial or frequency-domain approaches to calculate intensity or electromagnetic fields, or a combination, in air or in the other media including resist materials and on a chip surface;

procedures for allocation of pixel shaders for intensity and electromagnetic field calculations in air and in the resist material as well as other related locations on the chip surface including memory lookups or fast kernel calculations;

procedures for allocation of pixel shaders for intensity calculations using other methods of calculating intensity or electromagnetic fields, or a combination, such as convolution in frequency domain using fast fourier transforms and inverse fourier transforms or any other transforms to the same effect in air or in the resist material as well as other related locations on the chip surface;

procedures for allocation of pixel shaders for intensity calculations using fast kernel lookups or fast kernel calculations;

procedures for allocation of pixel shaders for intensity calculations using light lookups or light calculations;

procedures for allocation of depth filters for area query and tagging of edges and edge fragments;

procedures for pixel shader computation of evaluation points;

procedures for mapping of convolution tables as texture maps;

procedures for the use of texture interpolation for optimizing texture cache use;

procedures for the use of a depth processor for the selection of evaluation points; or procedures for the use of a single input multiple data (SIMD) video processor for computing error terms.

10. The system of claim 1 wherein in intensity calculation procedures, area search procedures, and placement error calculation procedures of an optical proximity correction calculation procedure are executed using a fragment processor unit of the graphics processing unit.

11. The system of claim 1 wherein in intensity calculation procedures, area search procedures, and optimization cost function calculations including edge placement error calculation procedures of an optical proximity correction procedure are executed using a fragment processor unit of the graphics processing unit.

12. The system of claim 10 wherein geometric operation procedures of the optical proximity correction calculation procedure are executed using the central processing unit.

13. The system of claim 10 wherein geometric operation procedures of the optical proximity correction calculation procedure are executed using a vertex processor unit of the graphics processing unit.

14. The system of claim 10 wherein geometric operation procedures of the optical proximity correction calculation procedure are executed using the fragment processor unit of the graphics processing unit.

15. The system of claim 10 wherein rectangle fragmentation procedures of the optical proximity correction calculation procedure are executed using the central processing unit.

16. The system of claim 10 wherein rectangle fragmentation procedures of the optical proximity correction calculation procedure are executed using a vertex processor unit of the graphics processing unit.

17. The system of claim 10 wherein rectangle fragmentation procedures of the optical proximity correction calculation procedure are executed using the fragment processor unit of the graphics processing unit.

18. The system of claim 10 wherein geometric operation and rectangle fragmentation procedures of the optical proximity correction calculation procedure are executed using the central processing unit.

19. The system of claim 1 wherein area search procedures of an optical proximity correction calculation procedure are executed using a stencil buffer of the graphics processing unit.

20. The system of claim 1 wherein placement error procedures of an optical proximity correction calculation procedure are executed using a video processor of the graphics processing unit.

21. The system of claim 1 wherein a two-dimensional trapezoidal shape of the data is represented as four-channel data in the graphics processing unit.

22. A system comprising:
a computing system comprising at least one central processing unit and at least one graphics processing unit;
a user interface for interacting with the computer system;
a computer readable medium comprising data describing size and placement of features to be formed on a photolithography exposure mask used to manufacture semiconductor devices;
a computer readable medium comprising optical proximity correction calculation procedures for acting upon the data, wherein at least a portion of the optical proximity correction calculation procedures are executed using the graphics processing unit; and
output devices for displaying the results of applying the optical proximity correction calculation procedures executed using the graphics processing unit upon the data,
wherein X and Y coordinates for a corner, a width, and a height of a two-dimensional trapezoidal shape of the data is represented in a RGBA (RED-GREEN-BLUE-ALPHA) color space format in the graphics processing unit.

23. A system comprising:
a computing system comprising at least one central processing unit and at least one graphics processing unit;
a user interface for interacting with the computer system;
a computer readable medium comprising data describing size and placement of features to be formed on a photolithography exposure mask used to manufacture semiconductor devices;
a computer readable medium comprising optical proximity correction calculation procedures for acting upon the data, wherein at least a portion of the optical proximity correction calculation procedures are executed using the graphics processing unit; and
output devices for displaying the results of applying the optical proximity correction calculation procedures executed using the graphics processing unit upon the data,
wherein X and Y coordinates for a corner, a change in X, and a change in Y of a two-dimensional trapezoidal shape of the data is represented in a RGBA (RED-GREEN-BLUE-ALPHA) color space format in the graphics processing unit.

24. A system comprising:
a computing system comprising at least one central processing unit and at least one graphics processing unit;
a user interface for interacting with the computer system;

a computer readable medium comprising data describing size and placement of features to be formed on a photolithography exposure mask used to manufacture semiconductor devices;

a computer readable medium comprising optical proximity correction calculation procedures for acting upon the data, wherein at least a portion of the optical proximity correction calculation procedures are executed using the graphics processing unit; and output devices for displaying the results of applying the optical proximity correction calculation procedures executed using the graphics processing unit upon the data, wherein X and Y coordinates for a corner, an angle, and a scalar of a two-dimensional trapezoidal shape of the data is represented in a RGBA (RED-GREEN-BLUE-ALPHA) color space format in the graphics processing unit.

* * * * *